United States Patent
Varrot et al.

(10) Patent No.: US 6,822,329 B2
(45) Date of Patent: Nov. 23, 2004

(54) INTEGRATED CIRCUIT CONNECTING PAD

(75) Inventors: Michel Varrot, Bernin (FR);
Guillaume Bouche, Grenoble (FR);
Roberto Gonella, Meylan (FR); Eric Sabouret, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/145,388

(22) Filed: May 14, 2002

(65) Prior Publication Data

US 2002/0179991 A1 Dec. 5, 2002

(30) Foreign Application Priority Data

May 18, 2001 (FR) .............................................. 01 06591

(51) Int. Cl.[7] .......................................... H01L 23/485
(52) U.S. Cl. ..................... 257/758; 257/508; 257/700; 257/698; 257/920; 257/781
(58) Field of Search ................................ 257/758, 700, 257/508, 659, 786, 698, 781, 773, 920, 459, 776

(56) References Cited

U.S. PATENT DOCUMENTS

| | | | |
|---|---|---|---|
| 5,736,791 A | 4/1998 | Fujiki et al. ................. 257/781 |
| 6,100,589 A | * 8/2000 | Tanaka ........................ 257/758 |
| 6,198,170 B1 | * 3/2001 | Zhao ........................... 257/784 |
| 6,297,563 B1 | * 10/2001 | Yamaha ....................... 257/781 |
| 6,313,540 B1 | 11/2001 | Kida et al. ................... 257/784 |
| 6,448,641 B2 | * 9/2002 | Ker et al. .................... 257/700 |

FOREIGN PATENT DOCUMENTS

EP 0 875 934 11/1998 .......... H01L/23/48

OTHER PUBLICATIONS

Patent abstracts of Japan vol. 2000, No. 10 published Jul. 14, 2000 and JP 2000195896 entitled Semiconductor Device.

* cited by examiner

*Primary Examiner*—Jerome Jackson
*Assistant Examiner*—Matthew Landau
(74) *Attorney, Agent, or Firm*—Allen, Dyer, Doppelt, Milbrath & Gilchrist, P.A.; Lisa K. Jorgenson

(57) ABSTRACT

Each connecting pad includes a continuous top metal layer on the top metallization level and having on its top face an area for welding a connecting wire. Also, the pad has a reinforcing structure under the welding area and includes at least one discontinuous metal layer on the immediately next lower metallization level, metal vias connecting the discontinuous metal layer to the bottom surface of the top metal layer, and an isolating cover covering the discontinuous metal layer and its discontinuities as well as the inter-via spaces between the two metallic layers.

24 Claims, 4 Drawing Sheets

INTEGRATED CIRCUIT CONNECTING PAD

FIELD OF THE INVENTION

The present invention relates to integrated circuits, and, more particularly, to the structure of the integrated circuit connecting pads.

BACKGROUND OF THE INVENTION

The connecting pads of an integrated circuit, which are generally disposed at its periphery, form the input/output terminals of the integrated circuit. The integrated circuit is conventionally encapsulated in resin packaging that also supports the metal pins that are intended to be soldered to an electronic circuit card. The connection between the connecting pads of the integrated circuit and the metal pins is made by wires that are generally gold or sometimes aluminum welded to the metal pins and to the metal top surface of the connecting pads.

With the structures usually used for the connecting pads, the operation of welding a wire to the top surface of the connecting pad introduces a risk of delamination and a risk of microcracks appearing in the structure of the connecting pad because of the high stresses applied to the gold ball to weld it or to crush the aluminum wire. This risk, even though it is under control in the technologies currently used, sometimes necessitates additional constraints in respect of the soldering machines, and in particular individual adjustment of the welding parameters.

Moreover, this risk of delamination and of microcracks appearing increases as the size of the connecting pads decreases, especially for a 0.18 $\mu$m or smaller technology.

SUMMARY OF THE INVENTION

An object of the invention is to provide a connecting pad structure that minimizes or even eliminates the risks of delamination and of microcracks appearing, even for advanced technologies, in particular for 0.18 $\mu$m and smaller technologies, in which the size of the gold ball deposited on the top surface of the connecting pad is especially small.

Another object of the invention is to provide a connecting pad that is structurally compatible with many applications, including radio frequency applications.

The invention therefore provides an integrated circuit including a plurality of levels of metallization and connecting pads. Each connecting pad includes a continuous top metal layer on the top metallization level and having on its top face an area for welding a connecting wire, and a reinforcing structure under the welding area and including at least one discontinuous metal layer on the immediately next lower metallization level, metal vias connecting the discontinuous metal layer to the bottom surface of the top metal layer, and an isolating covering that covers the discontinuous metal layer and its discontinuities as well as the inter-via spaces between the two metallic layers.

It should be noted that combining a discontinuous metal layer with metal vias connecting the discontinuous layer to the top layer, the combination being covered in an isolating covering, for example of silicon dioxide, forms a reinforcing structure that is mechanically strong to resist the stresses applied during welding. The vias attach the top layer to the isolation, which helps to minimize the risk of delamination, and the discontinuous layer compensates the weaknesses of the isolating covering caused by the vias and in particular minimizes the appearances of microcracks.

As used herein, the term "discontinuous metal layer" advantageously includes separate distinct metal discontinuities.

Although the discontinuous metal layer can be formed in various ways, it is particularly advantageous if it is formed of regularly distributed discontinuous individual patterns each formed of a plurality of separate parallel metal strips, for example, each metal strip then supporting a plurality of separate metal vias.

Moreover, with the desire to avoid a predominant direction of the discontinuities of the metal layer, which could be problematic if that direction were to correspond to the general direction of vibration of the connecting pad during ultrasound welding, it is preferable for the respective general orientations of two adjacent patterns to be different, for example orthogonal.

Moreover, although it is additionally possible to use the reinforcing structure, especially the discontinuous metal layer and the vias, to form an electrical connection between the connecting wires and the bottom metallization layers of the integrated circuit, it is particularly advantageous, in particular to avoid too high a capacitance of the connecting pad (which is particularly beneficial in radio frequency applications), for the connecting pad to include a peripheral metal ring situated on the same metallization level as the discontinuous metal layer, surrounding the discontinuous metal layer and electrically isolated from it by the isolating covering. Moreover, peripheral metal vias then connect the peripheral ring to a peripheral area of the bottom surface of the top metal layer.

Moreover, to enable an electrical contact to be provided on any metallization level of the integrated circuit, the connecting pad can include a plurality of stacked peripheral metal rings on respective different metallization levels, each peripheral ring being connected to the immediately adjacent ring by peripheral metal vias. The reinforcing structure can include a single discontinuous metal layer situated immediately under the top metal layer of the connecting pad. In this case, the isolating covering of the connecting pad can extend as far as the integrated circuit bulk. This kind of architecture is particularly beneficial in radio frequency applications, because the connecting pad then has a relatively low capacitance.

This being the case, in other applications the reinforcing structure can include a plurality of stacked discontinuous metal layers on respective different metallization levels and connected to each other by metal vias. The isolating covering then also covers each discontinuous metal layer and its discontinuities as well as the inter-via spaces between two adjacent discontinuous metal layers.

Still with an object of increasing the mechanical strength of the structure, in particular to resist vibration resulting from ultrasound-assisted welding, it is advantageous for two stacked patterns belonging to two respective adjacent discontinuous metal levels to be offset from each other or to have respective different, for example orthogonal, general orientations. The metal layers of the connecting pad can be of aluminum and the vias of tungsten. It is nevertheless equally possible for the metal layers and the vias to be of copper. However, in this case, the discontinuity of each discontinuous metal layer is advantageously chosen so that the copper density is from approximately 20% to approximately 80% in a 50 $\mu$m×50 $\mu$m window, to be compatible with a mechanical-chemical polishing step used in the process, e.g. a damascene process, for producing lines and vias.

BRIEF DESCRIPTION OF THE DRAWINGS

Other advantages and features of the invention will become apparent on examining the detailed description of non-limiting embodiments and the accompanying drawings, in which.

DETAILED DESCRIPTION OF THE PREFERRED EMBODIMENTS

Figure 1:
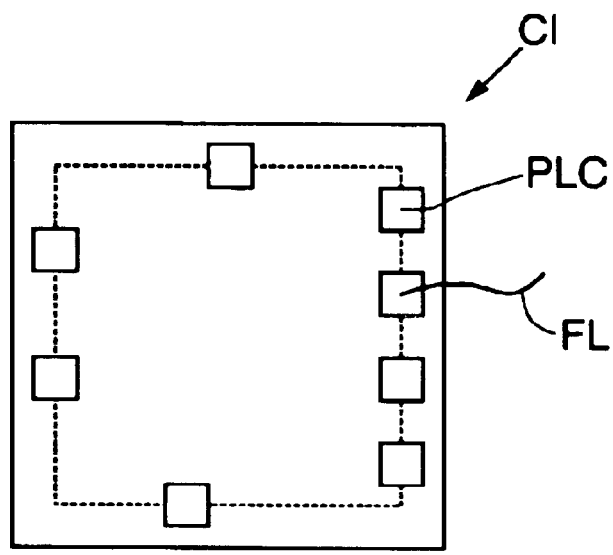
FIG. 1 is a schematic diagram showing an integrated circuit in accordance with the invention equipped with connecting pads.

FIG. 1 shows an integrated circuit CI conventionally including electronic components (transistors, etc.) in a central area of the silicon bulk and, at the periphery of the chip, connecting pads PLC to each of which a connecting wire FL, generally of gold, is welded. The connecting wire is also welded to a metal pin of a lead frame. The combination is then encapsulated in resin packaging to form a component ready to be soldered to an electronic circuit board. The connecting pads PLC form input/output terminals of the integrated circuit CI.

Figure 2:
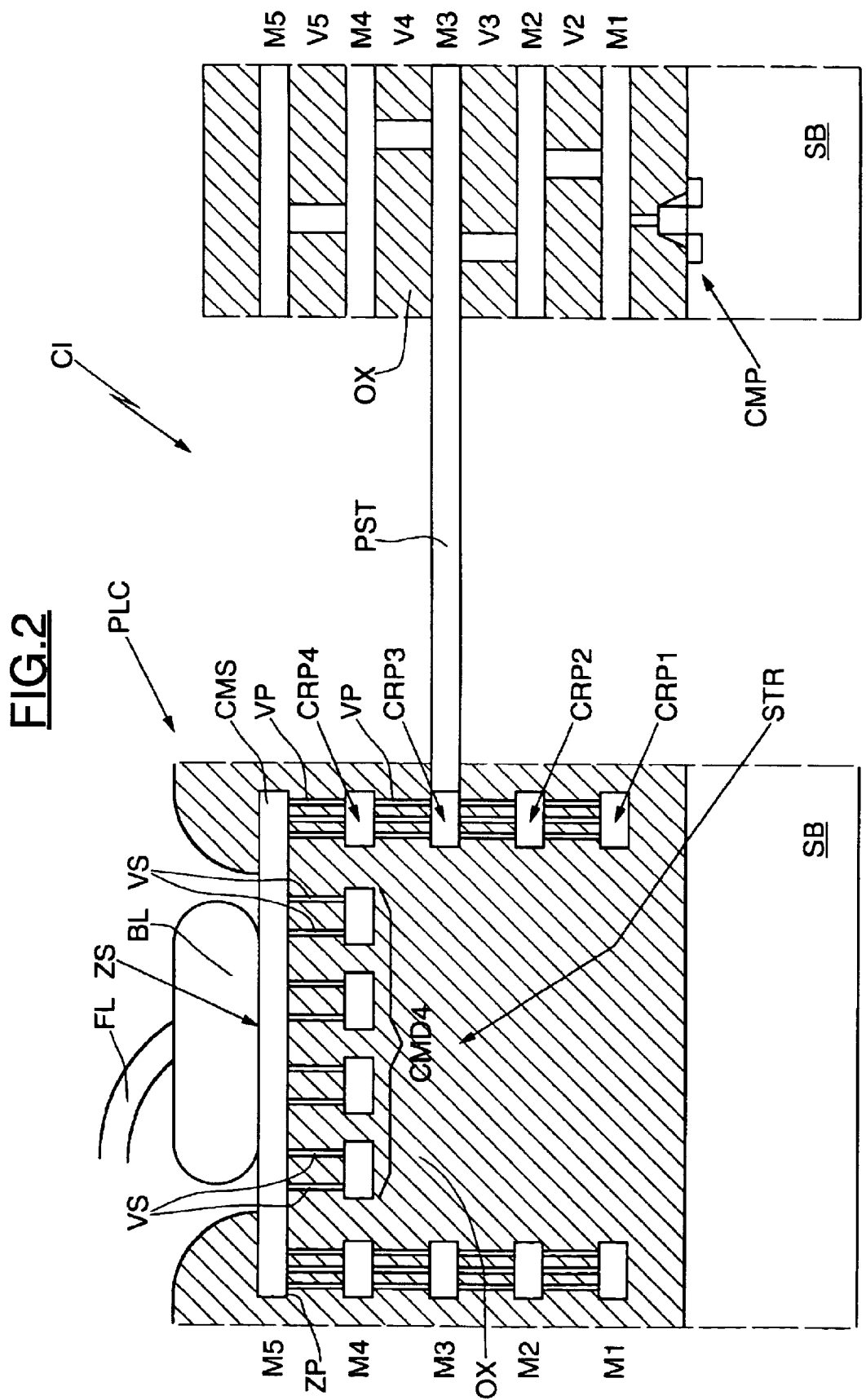
FIG. 2 is a schematic cross-sectional view of one embodiment of a connecting pad according to the invention.

FIG. 2 shows a diagrammatic vertical section of the integrated circuit with the internal architecture of a connecting pad PLC on the left-hand side and the various levels of metallization and vias of the integrated circuit, for interconnecting the various electronic components CMP of the integrated circuit, on the right-hand side. In FIG. 2, some dimensions have been intentionally exaggerated and others intentionally made smaller to simplify and clarify the drawing.

This example presupposes, by way of illustration, that the integrated circuit includes five levels of metallization M1–M5 and four levels of vias V2–V5. A via is a metal interconnection pad for connecting two tracks on two adjacent metallization levels. This is well known to the person skilled in the art.

An isolating material OX, for example silicon dioxide, conventionally isolates the vias from each other and the metallization levels from each other. Moreover, oxide also isolates the various tracks or metal lines produced on each metallization level. In the right-hand part of FIG. 2, for reasons of simplification, the array of tracks and the corresponding intertrack isolating material on each metallization level are not shown.

The left-hand part of FIG. 2 shows that the connecting pad PLC includes a continuous top metal layer CMS situated at the top metallization layer of the integrated circuit, here the metallization layer M5. The continuous top metal layer has on its top face an area ZS for welding a connecting wire FL to it via a gold ball BL. The stresses applied to the ball BL during welding can lead to the risk of microcracks appearing in the connecting pad and to the risk of delamination, i.e. the risk of detaching the top metal layer CMS from the underlying oxide. The connecting pad structure in accordance with the invention described next minimizes or even eliminates this risk, even for advanced technologies, for example 0.18 $\mu$m and smaller technologies.

To this end, the invention provides a reinforcing structure STR under the welding area. The reinforcing structure includes at least one discontinuous metal layer CMD4 on the immediately next lower metallization level, i.e. in this instance the metallization level M4. The reinforcing structure STR further includes metal vias VS connecting the discontinuous metal layer CMD4 to the bottom surface of the top metal layer CMS.

The reinforcing structure further includes an isolating covering OX, for example of silicon dioxide, covering the discontinuous metal layer CMD4 and its discontinuities and the inter-via spaces between the layer CMD4 and the top metal layer CMS.

In the example shown in FIG. 2, in which the reinforcing structure includes only one discontinuous metal layer CMD4, the isolating covering OX extends as far as the top surface of the bulk SB and is formed of various inter-line and inter-via oxide layers conventionally used in the fabrication of integrated circuits. Using only one discontinuous metal layer CMD4 has the advantage that there is a relatively low capacitance between the connecting pad PLC and the bulk SB, which is particularly advantageous in radio frequency applications.

Moreover, the connecting pad PLC includes a peripheral metal ring CRP4 on the same metallization level as the discontinuous metal layer CMD4, i.e. on the metallization layer M4. The metal ring CRP4 surrounds the discontinuous metal layer CMD4 and is electrically isolated from it by the isolating covering OX. Moreover, peripheral metal vias VP connect the metal ring CRP4 to a peripheral area ZP of the bottom surface of the top metal layer CMS.

Although it would be entirely feasible to provide only one metal ring CRP4, it is nevertheless advantageous for the connecting pad PLC to include a plurality of stacked metal rings CRP1, CRP2, CRP3, CRP4 on different metallization levels, in this instance on the respective metallization levels M1, M2, M3 and M4. Each peripheral ring is connected to the immediately adjacent ring by peripheral metal vias VP which are therefore on different levels of vias.

It is therefore possible to connect the connecting pad PLC to the components CMP of the integrated circuit on any metallization level and in accordance with the layout of the tracks of the integrated circuit. For example, FIG. 2 shows a track PST which is on the metallization level M3 and contacts the metal ring CRP3 to create an electrical connection between the contact pad PLC and some of the components of the integrated circuit.

Although the embodiment of the connecting pad shown in FIG. 2 is particularly suitable for radio frequency applications, it can equally well be used for other applications. This avoids using connecting pads with different structures for different applications.

Figure 3:
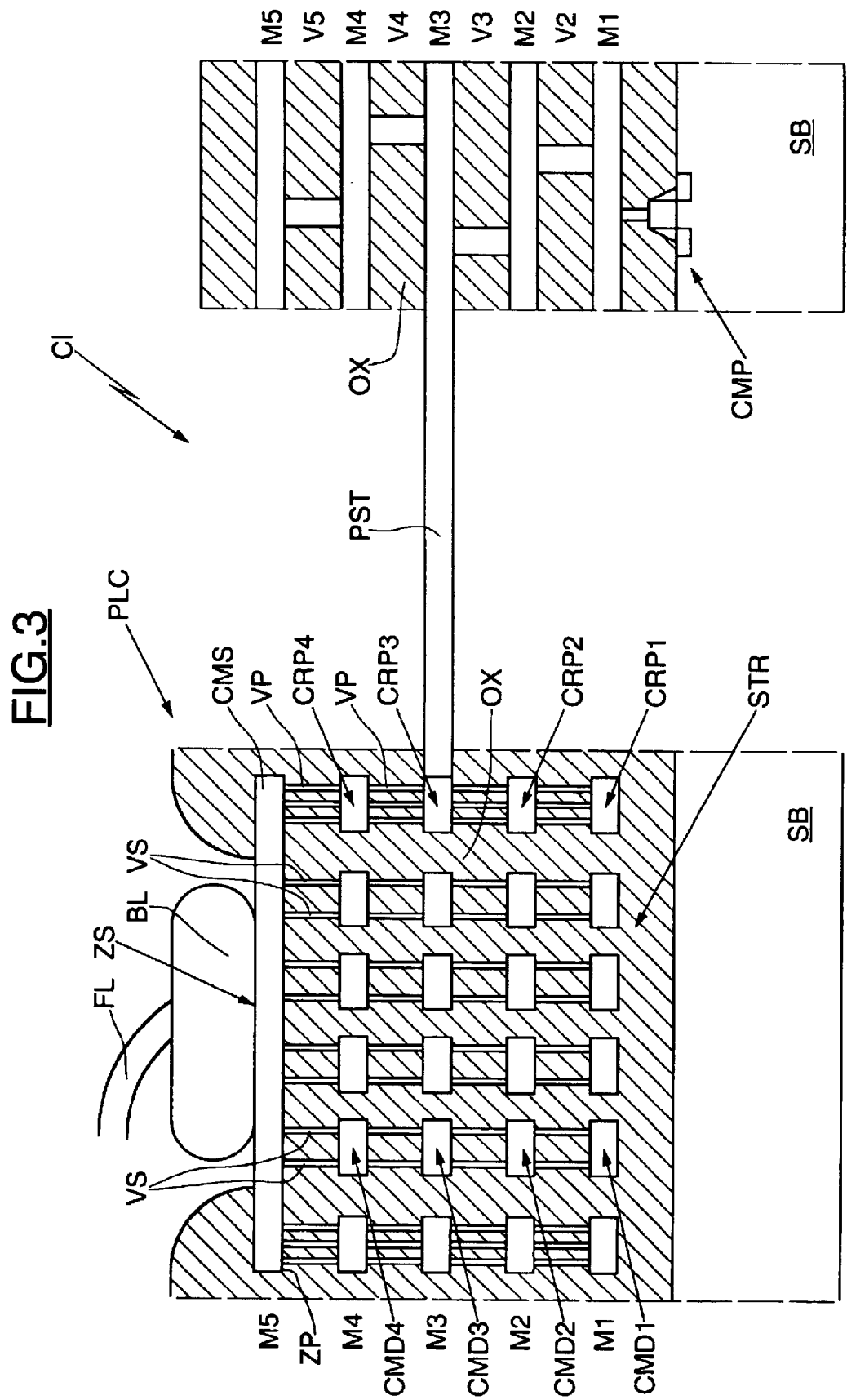
FIG. 3 is a schematic cross-sectional view of another embodiment of a connecting pad according to the invention.

It is possible to envisage the reinforcing structure STR including, as shown in FIG. 3, a plurality of stacked discontinuous metal layers CMD1, CMD2, CMD3, CMD4 interconnected by metal vias VS. The insulating covering OX then also covers each discontinuous metal layer and its discontinuities as well as the inter-via spaces between two adjacent discontinuous metal layers. The discontinuities of each discontinuous metal layer can be formed in various ways and can have various dimensions, but always with a minimum spacing between two discontinuities corresponding to the minimum distance between two adjacent lines in the technology used. Thus for a 0.18 $\mu$m technology, the minimum width of a discontinuity is 0.32 $\mu$m.

Figure 4:
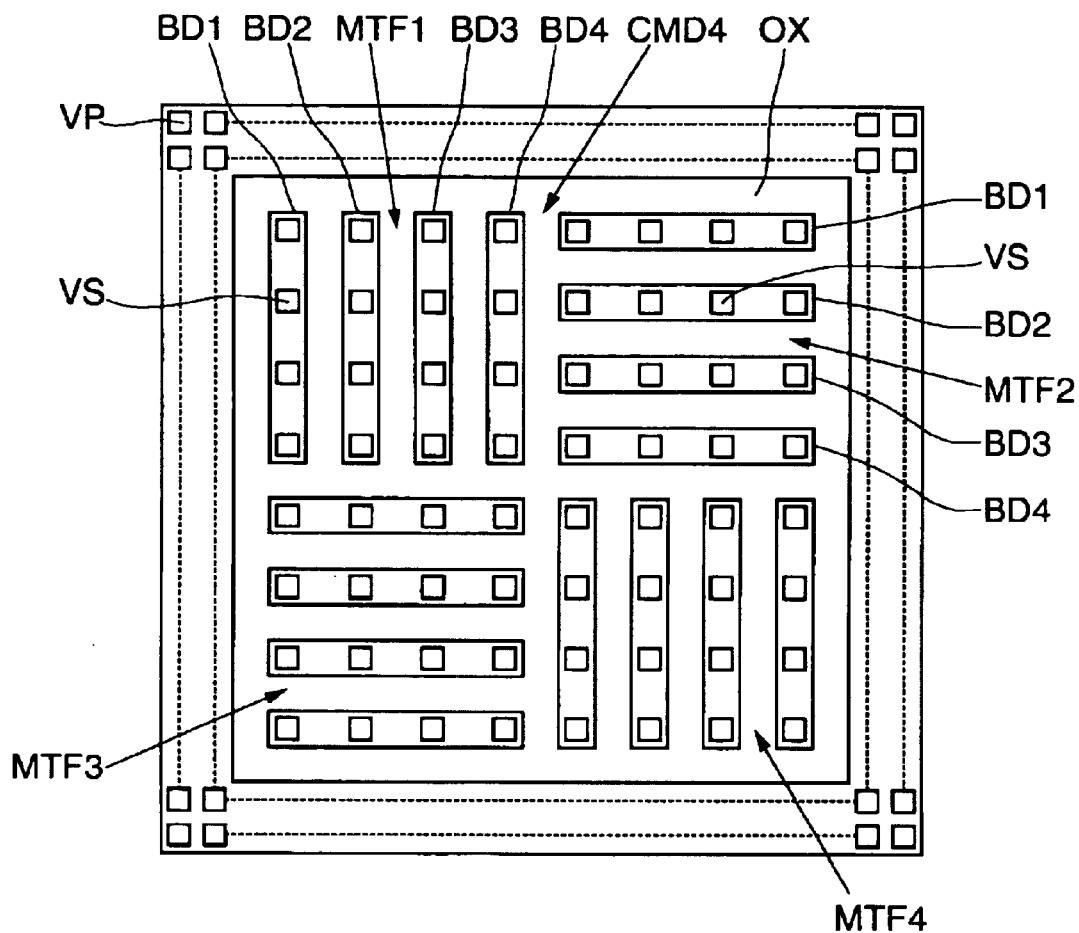
FIGS. 4 and 5 are schematic diagrams showing in more detail one embodiment of a reinforcing structure in accordance with the invention.

This being so, FIG. 4 shows one embodiment of a discontinuous metal layer of this kind. FIG. 4 shows that the discontinuous metal layer CMD4, which is surrounded by the peripheral ring CRP4, has a regularly distributed pattern. In this instance, each pattern MTFi is formed of a plurality of (for example four) separate parallel metal strips BD1–BD4. Each metal strip supports a plurality of (here four) parallel separate metal vias VS. For example, the metal strips of a pattern have a width of 1 $\mu$m, a length of 7 $\mu$m and a spacing of 1 $\mu$m. Moreover, the width of the metal vias VS is 0.32 $\mu$m and they are spaced by approximately 1.5 $\mu$m.

So that the discontinuities of the discontinuous metal layer do not have a predominant direction, and to thereby minimize the risk of shear during ultrasound-assisted welding, it is preferable, as shown in FIG. 4, for the respective general orientations of two adjacent patterns to be different, for example orthogonal. To be more precise, as shown in FIG. 4, in which, for simplicity, only four patterns MTF1, MTF2, MTF3 and MTF4 are shown, it can be seen that the general direction of the pattern MTF2 is orthogonal to that of the pattern MTF1 and to that of the pattern MTF4. Likewise, the general direction of the pattern MTF3 is orthogonal to that of the pattern MTF1 and to that of the pattern MTF4.

The metal ring CRP4 is equipped with a matrix of peripheral vias VP regularly distributed around the peripheral ring CRP4, for example. Moreover, if the connecting pad includes a plurality of adjacent discontinuous metal layers on different metallization levels, and still with the object of minimizing the risk of shear, it is preferable for two stacked patterns belonging to respective adjacent discontinuous metal layers to have respective different, for example orthogonal, general orientations.

Figure 5:
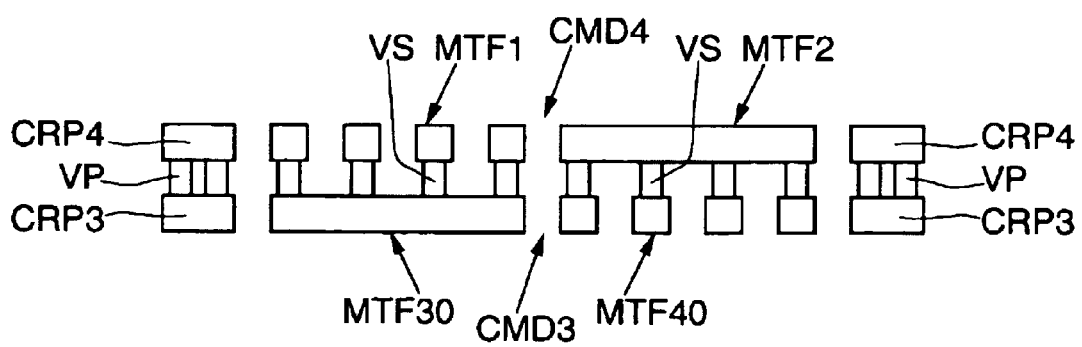

To be more precise, as shown in FIG. 5, the general direction of the pattern MTF1 of the layer CMD4 has a general direction orthogonal to that of the pattern MTF30 of the layer CMD3 (the pattern MTF30 is analogous to the pattern MTF3). Likewise, the general direction of the pattern MTF2 of the layer CMD4 is orthogonal to that of the pattern MTF40, which is analogous to the pattern MTF4.

Figure 6:
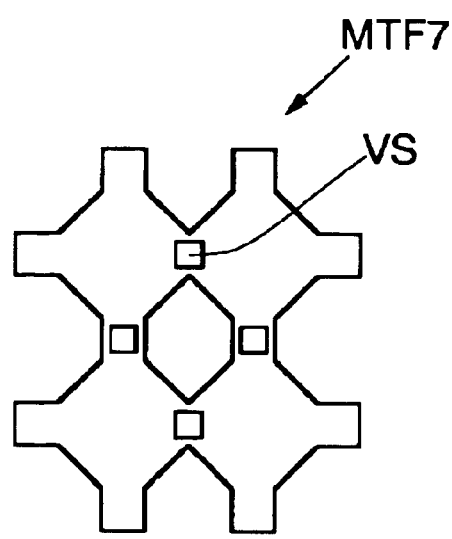
FIG. 6 shows another embodiment of a discontinuous pattern of a reinforcing structure in accordance with the invention.

Of course, the invention is not limited to this type of discontinuous pattern. For example, it is possible to envision the pattern MTF7 shown in FIG. 6, which includes four stars with metal vias VS at their four intersections. If a plurality of discontinuous metal layers are used, the patterns can be offset from one layer to the other, so that the central orifices of two stacked patterns do not coincide.

In practice the metal layers can be aluminum and the vias may be tungsten. They are then produced conventionally. To be more precise, the discontinuous layers are produced by etching the aluminum. Instead of this, the metal lines and the vias of the integrated circuit can be copper. In this case, the discontinuous metal layers and the vias are produced conventionally, for example by a damascene process well known to the person skilled in the art, including depositing the oxide OX and then etching it and filling the cavities with copper before mechanical-chemical polish. However, with this kind of implementation, it is preferable for the density of the copper in the discontinuous metal layers to be from approximately 20% to approximately 80% in a 50 $\mu$m×50 $\mu$m window, to prevent flatness defects in the integrated circuit between the edge of the die and its core, i.e. hollowing of the copper areas. This density of metal is also preferable if the metal layers are of aluminum.

That which is claimed is:

1. An integrated circuit comprising:
   a plurality of metallization levels; and
   a plurality of input/output connecting pads, each connecting pad comprising
      a continuous top metal layer on a top metallization level and having a welding area for welding a connecting wire on a top face thereof, and
      a reinforcing structure under the welding area and including
         at least one discontinuous metal layer on a next metallization level under the top metallization level, the discontinuous metal layer comprising a plurality of metal patterns with adjacent metal patterns having transverse orientations,
         metal vias connecting the discontinuous metal layer to a bottom surface of the top metal layer, and
         an isolation material isolating metallization levels from each other, and isolating the metal vias from each other.

2. An integrated circuit according to claim 1, wherein each pattern is formed of a plurality of spaced-apart parallel metal strips each supporting a plurality of the metal vias.

3. An integrated circuit according to claim 1, wherein the top metal layer comprises a peripheral area on the bottom surface thereof, each connecting pad includes a peripheral metal ring on the next metallization level under the top metallization level and surrounding the discontinuous metal layer and electrically isolated from the discontinuous metal layer by the isolating material, and peripheral metal vias connect the peripheral area of the top metal layer to the peripheral ring.

4. An integrated circuit according to claim 3, wherein each connecting pad includes a plurality of stacked peripheral metal rings on respective different metallization levels and connected to each other by peripheral metal vias.

5. An integrated circuit according to claim 1, wherein the metal layers comprise aluminum and the vias comprise tungsten.

6. An integrated circuit according to claim 1, wherein the metal layers and the vias comprise copper and the copper density of the at least one discontinuous metal layer is from about 20% to about 80% in about a 50 $\mu$m by 50 $\mu$m area.

7. An integrated circuit comprising:
   a plurality of metallization levels; and
   a plurality of circuit connecting pads, each connecting pad comprising
      a top metal layer on an uppermost metallization level, and
      a reinforcing structure under the top metal layer and including
         a discontinuous metal layer on a next metallization level under the uppermost metallization level, the discontinuous metal layer comprising a plurality of metal patterns with adjacent metal patterns having transverse orientations,
         metal vias connecting the discontinuous metal layer to the top metal layer, and
         a dielectric material insulating metallization levels from each other, and insulating the metal vias from each other.

8. An integrated circuit according to claim 7, wherein each pattern is formed of a plurality of spaced-apart parallel metal strips each supporting a plurality of the metal vias.

9. An integrated circuit according to claim 7, wherein the top metal layer comprises a peripheral area, each connecting pad includes a peripheral metal ring on the next metallization level under the top metallization level and surrounding the discontinuous metal layer and electrically insulated from the discontinuous metal layer by the dielectric material, and metal vias connect the peripheral area of the top metal layer to the peripheral ring.

10. An integrated circuit according to claim 9, wherein each connecting pad includes a plurality of stacked peripheral metal rings on respective different metallization levels and connected to each other by metal vias.

11. An integrated circuit according to claim 7, wherein the metal layers comprise aluminum and the vias comprise tungsten.

12. An integrated circuit according to claim 7, wherein the metal layers and the vias comprise copper and the copper density of the at least one discontinuous metal layer is from about 20% to about 80% in about a 50 μm by 50 μm area.

13. A method of making an integrated circuit comprising:
providing a plurality of metallization levels; and
forming a plurality of circuit connecting pads by
    forming a top metal layer on an uppermost metallization level, and
    forming a reinforcing structure under the top metal layer and including
        forming a discontinuous metal layer on a next metallization level under the uppermost metallization level, the discontinuous metal layer comprising a plurality of metal patterns with adjacent metal patterns having transverse orientations,
        connecting the discontinuous metal layer to the top metal layer with metal vias, and
        insulating metallization levels from each other and insulating the metal vias from each other with a dielectric material.

14. The method according to claim 13, wherein each pattern is formed of a plurality of spaced-apart parallel metal strips each supporting a plurality of the metal vias.

15. The method according to claim 13, wherein the top metal layer comprises a peripheral area, each connecting pad includes a peripheral metal ring on the next metallization level under the top metallization level and surrounding the discontinuous metal layer and electrically insulated from the discontinuous metal layer by the dielectric material, and metal vias connect the peripheral area of the top metal layer to the peripheral ring.

16. The method according to claim 15, wherein each connecting pad includes a plurality of stacked peripheral metal rings on respective different metallization levels and connected to each other by metal vias.

17. The method according to claim 13, wherein the metal layers comprise aluminum and the vias comprise tungsten.

18. The method according to claim 13, wherein the metal layers and the vias comprise copper and the copper density of the at least one discontinuous metal layer is from about 20% to about 80% in about a 50 μm by 50 μm area.

19. An integrated circuit comprising:
a plurality of metallization levels; and
a plurality of input/output connecting pads, each connecting pad comprising
    a continuous top metal layer on a top metallization level and having a welding area for welding a connecting wire on a top face thereof, and
    a reinforcing structure under the welding area and including
        a plurality of stacked discontinuous metal layers on respective different metallization levels with at least one discontinuous metal layer on a next metallization level under the top metallization level, each discontinuous metal layer comprising a plurality of metal patterns and adjacent metal patterns on each discontinuous metal layer having transverse orientations, and metal patterns on respective adjacent discontinuous metal layers having transverse orientations,
        metal vias connecting the plurality of stacked discontinuous metal layers to each other and connecting the discontinuous metal layer to a bottom surface of the top metal layer, and
        an isolation material isolating metallization levels from each other, and isolating the metal vias from each other.

20. An integrated circuit according to claim 19 wherein each pattern is formed of a plurality of spaced-apart parallel metal strips each supporting a plurality of the metal vias.

21. An integrated circuit comprising:
a plurality of metallization levels; and
a plurality of circuit connecting pads, each connecting pad comprising
    a top metal layer on an uppermost metallization level, and
    a reinforcing structure under the top metal layer and including
        a plurality of stacked discontinuous metal layers on respective different metallization levels with a first discontinuous metal layer on a next metallization level under the uppermost metallization level, each discontinuous metal layer comprising a plurality of metal patterns and adjacent metal patterns on each discontinuous metal layer having transverse orientations, and metal patterns on respective adjacent discontinuous metal layers having transverse orientations,
        metal vias connecting the plurality of stacked discontinuous metal layers to each other and connecting the first discontinuous metal layer to the uppermost metal layer, and
        a dielectric material insulating metallization levels from each other, and insulating the metal vias from each other.

22. An integrated circuit according to claim 21, wherein each pattern is formed of a plurality of spaced-apart parallel metal strips each supporting a plurality of the metal vias.

23. A method of making an integrated circuit comprising:
providing a plurality of metallization levels; and
forming a plurality of circuit connecting pads by
    forming a top metal layer on an uppermost metallization level, and
    forming a reinforcing structure under the top metal layer and including
        forming a plurality of stacked discontinuous metal layers on respective different metallization levels with a first discontinuous metal layer on a next metallization level under the uppermost metallization level, each discontinuous metal layer comprising a plurality of metal patterns and adjacent metal patterns on each discontinuous metal layer having transverse orientations, and metal patterns on respective adjacent discontinuous metal layers having transverse orientations,
        connecting the plurality of stacked discontinuous metal layers to each other and connecting the discontinuous metal layer to the top metal layer with metal vias, and
        insulating metallization levels from each other and insulating the metal vias from each other with a dielectric material.

24. The method according to claim 23, wherein each pattern is formed of a plurality of spaced-apart parallel metal strips each supporting a plurality of the metal vias.

* * * * *